US012577667B2

(12) United States Patent
Lim et al.

(10) Patent No.: US 12,577,667 B2
(45) Date of Patent: Mar. 17, 2026

(54) CYCLIC ALKYL AMINO CARBENE (CAAC) DEPOSITION BY TRANSMETALLATION

(71) Applicants: Applied Materials, Inc., Santa Clara, CA (US); National University of Singapore, Singapore (SG)

(72) Inventors: Wei Chun Lim, Singapore (SG); Andrea Leoncini, Singapore (SG); Han Vinh Huynh, Singapore (SG); Sara Raquel Mota Merelo de Aguiar, Singapore (SG)

(73) Assignees: Applied Materials, Inc., Santa Clara, CA (US); National University of Singapore, Singapore (SG)

( * ) Notice: Subject to any disclaimer, the term of this patent is extended or adjusted under 35 U.S.C. 154(b) by 83 days.

(21) Appl. No.: 18/621,643

(22) Filed: Mar. 29, 2024

(65) Prior Publication Data

US 2025/0305138 A1 Oct. 2, 2025

(51) Int. Cl.
*C23C 16/455* (2006.01)
*C23C 16/18* (2006.01)
*C23C 16/44* (2006.01)

(52) U.S. Cl.
CPC ........ *C23C 16/45551* (2013.01); *C23C 16/18* (2013.01); *C23C 16/4408* (2013.01); *C23C 16/45553* (2013.01)

(58) Field of Classification Search
CPC ........ C23C 16/0272; C23C 16/04–042; C23C 16/45534
See application file for complete search history.

(56) References Cited

U.S. PATENT DOCUMENTS

| | | | |
|---|---|---|---|
| 7,214,600 B2 | 5/2007 | Won et al. | |
| 11,120,995 B2 | 9/2021 | Hsu et al. | |
| 11,545,354 B2 | 1/2023 | Bhuyan et al. | |
| 2012/0323008 A1* | 12/2012 | Barry ........................ | C07F 1/00 206/524.1 |
| 2016/0060754 A1 | 3/2016 | Noh et al. | |
| 2016/0343580 A1 | 11/2016 | Hudson | |

(Continued)

FOREIGN PATENT DOCUMENTS

| | | |
|---|---|---|
| CN | 113838744 A | 12/2021 |
| JP | 2019212776 A | 12/2019 |

(Continued)

OTHER PUBLICATIONS

Alfredo Mameli and Andrew V. Teplyakov, Selection Criteria for Small-Molecule Inhibitors in Area-Selective Atomic Layer Deposition: Fundamental Surface Chemistry Considerations, Accounts of Chemical Research 2023 56 (15), 2084-2095.*

(Continued)

*Primary Examiner* — Alex A Rolland
(74) *Attorney, Agent, or Firm* — Servilla Whitney LLC

(57) ABSTRACT

Methods of depositing a passivation layer on a semiconductor substrate are described. The methods may include exposing a semiconductor substrate having a metal layer thereon to a precursor to form a passivation layer on the metal layer, the precursor having a general formula (I), where exposing the semiconductor substrate to the precursor may include a transmetallation process. The method may further include purging the semiconductor substrate.

19 Claims, 4 Drawing Sheets

(56) References Cited

U.S. PATENT DOCUMENTS

| | | | | |
|---|---|---|---|---|
| 2017/0352533 | A1 | 12/2017 | Tois et al. | |
| 2017/0352550 | A1 | 12/2017 | Tois et al. | |
| 2018/0342388 | A1 | 11/2018 | Chakraborty et al. | |
| 2019/0294046 | A1 | 9/2019 | Nishimaki et al. | |
| 2019/0368034 | A1 | 12/2019 | Liu et al. | |
| 2021/0175092 | A1 | 6/2021 | Tois et al. | |
| 2021/0277516 | A1 | 9/2021 | Bhuyan et al. | |
| 2022/0028686 | A1 | 1/2022 | Bhuyan et al. | |
| 2022/0127717 | A1* | 4/2022 | Wang | C23C 22/82 |
| 2022/0131096 | A1 | 4/2022 | Wang et al. | |

FOREIGN PATENT DOCUMENTS

| | | | |
|---|---|---|---|
| KR | 20020043702 | A | 6/2002 |
| WO | 2019173074 | A2 | 9/2019 |

OTHER PUBLICATIONS

Sebastian Termühlen, Patrick D. Dutschke, Alexander Hepp, and F. Ekkehardt Hahn, Synthesis of CAAC Complexes by Oxidative Addition of 2-Chloro-3,3-dimethyl-N-ethylindoleninium Cations to Carbonylmetalates and Subsequent Transmetalation, Organometallics 2023 42 (6), 473-478.*

Bidal, Yannick D., et al., "Generalization of the Copper to Late-Transition-Metal Transmetallation to Carbenes beyond N-Heterocyclic Carbenes", Chem. Eur. J. 2016, 22, 9404-9409.

Peltier, Jesse L., et al., "Absolute Templating of M(111) Cluster Surrogates by Galvanic Exchange", HAL Open Science, Journal of the American Chemical Society, 2020, 11 pages.

Termuhlen, Sebastian , et al., "Synthesis of CAAC Complexes by Oxidative Addition of 2-Chloro-3,3-dimethyl-N-ethylindoleninium Cations to Carbonylmetalates and Subsequent Transmetalation", Organometallics 2023, 42, 473-478.

Zhang, Chao , et al., "Area-Selective Molecular Layer Deposition of Polyimide on Cu through Cu-Catalyzed Formation of a Crystalline Interchain Polyimide", Chem. Mater. 2020, 32, 5073-5083.

* cited by examiner

CYCLIC ALKYL AMINO CARBENE (CAAC) DEPOSITION BY TRANSMETALLATION

TECHNICAL FIELD

Embodiments of the disclosure relate to methods for selectively depositing a passivation layer on a semiconductor substrate. In particular, embodiments of the disclosure are directed to methods of depositing carbene-based layers selectively on metal surfaces over non-metal surfaces.

BACKGROUND

The semiconductor processing industry continues to strive for larger production yields while increasing the uniformity of layers deposited on substrates having larger surface areas. These same factors in combination with new materials also provide higher integration of circuits per unit area of the substrate. As circuit integration increases, the need for greater uniformity and process control regarding layer thickness rises. As a result, various technologies have been developed to deposit layers on substrates in a cost-effective manner, while maintaining control over the characteristics of the layer.

The semiconductor industry faces many challenges in the pursuit of device miniaturization which involves rapid scaling of nanoscale features. Such issues include the introduction of complex fabrication steps such as multiple lithography steps and integration of high-performance materials. To maintain the cadence of device miniaturization, selective deposition has shown promise as it has the potential to remove costly lithographic steps by simplifying integration schemes.

Selective deposition of materials can be accomplished in a variety of ways. A chemical precursor may react selectively with one surface relative to another surface (metallic or dielectric). Process parameters such as pressure, substrate temperature, precursor partial pressures, and/or gas flows might be modulated to modulate the chemical kinetics of a particular surface reaction. Another possible scheme involves surface pretreatments that can be used to activate or deactivate a surface of interest to an incoming film deposition precursor.

Area-selective deposition (ASD) can be used for selective deposition of carbon-containing precursors on one substrate surface over another substrate surface, such as on a metal/metallic surface over a dielectric surface. During ASD on a metal/metallic surface, material deposition on the metal/metallic surface requires the development of molecules that can form a passivation layer that is both chemically and thermally stable on the metal/metallic surface, while at the same time having a high selectivity for the metal/metallic surface over the dielectric surface. There is an ongoing need in the art, therefore, for methods to improve the stability of passivation layers and to avoid the problems encountered during ASD.

SUMMARY

One or more embodiments of the disclosure are directed to a method of depositing a film. A method of selectively depositing a film comprises:

Another embodiment of the disclosure is directed to a method of selectively depositing a film. In one or more embodiments, a method of depositing a passivation layer on a semiconductor substrate, the method comprising exposing a semiconductor substrate having a metal layer thereon to a precursor to form a passivation layer on the metal layer, the precursor having a general formula (I), wherein $R^1$ is selected from the group consisting of substituted or unsubstituted linear or branched $C_{1-24}$ alkyl, substituted or unsubstituted $C_{5-7}$ cyclic alkyl, substituted or unsubstituted phenyl, and benzyl substituted with alkyl, alkoxy, or thio; $R^2$ and $R^{2'}$are each independently selected from the group consisting of substituted or unsubstituted linear or branched $C_{1-24}$ alkyl, substituted or unsubstituted $C_{5-7}$ cyclic alkyl, substituted or unsubstituted phenyl, and benzyl substituted with alkyl, alkoxy, or thio; X is selected from the group consisting of $NR^3$, $CR^4R^5$, O, and S, wherein $R^3$, $R^4$ and $R^5$ each independently comprise H or substituted or unsubstituted linear or branched $C_{1-24}$ alkyl; M comprises a metal; and $L^1$ comprises an anionic ligand.

Another embodiment of the disclosure is directed to a method of depositing a passivation layer on a semiconductor substrate, the method comprising: exposing a semiconductor substrate having a metal layer thereon to a neutral ligand $L^2$ to form a complex of the metal layer and the neutral ligand $L^2$, wherein the neutral ligand $L^2$ comprises one or more of (tri)alkylphosphine, (tri)alkylamine, vinylsilane, substituted acetylenes, substituted alkenes, cyclooctadiene, and cyclohexadiene; exposing the complex of the metal layer and the neutral ligand $L^2$ to a precursor to form a passivation layer on the metal layer, the precursor having a general formula (I), wherein $R^1$ is selected from the group consisting of substituted or unsubstituted linear or branched phenyl, and benzyl substituted with alkyl, alkoxy, or thio; $R^2$ and $R^2$ are each independently selected from the group consisting of substituted or unsubstituted linear or branched $C_{1-24}$ alkyl, substituted or unsubstituted $C_{5-7}$ cyclic alkyl, substituted or unsubstituted phenyl, and benzyl substituted with alkyl, alkoxy, or thio; X is selected from the group consisting of $NR^3$, $CR^4R^5$, O, and S, wherein $R^3$, $R^4$ and $R^5$ each independently comprise H or substituted or unsubstituted linear or branched $C_{1-24}$ alkyl; M comprises a metal; and $L^1$ comprises an anionic ligand.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments. The embodiments as described herein are illustrated by way of example and not limitation in the figures of the accompanying drawings in which like references indicate similar elements.

DETAILED DESCRIPTION

Figure 1A:
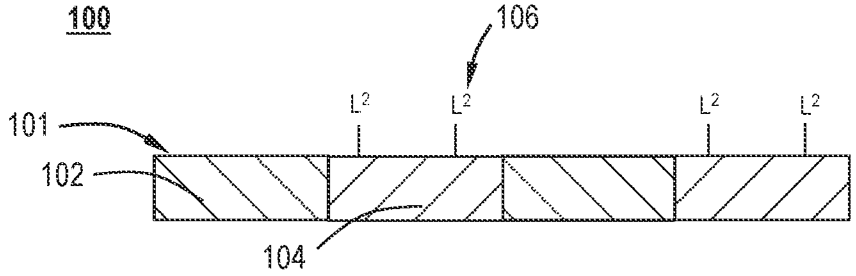
FIG. 1A illustrates a cross-sectional view of a substrate and a precursor selectively binding to a metal surface of the substrate according to one or more embodiments.

Before describing several exemplary embodiments of the disclosure, it is to be understood that the disclosure is not limited to the details of construction or process steps set forth in the following description. The disclosure is capable of other embodiments and of being practiced or being carried out in various ways.

The term "about" as used herein means approximately or nearly and in the context of a numerical value or range set forth means a variation of ±15%, or less, of the numerical value. For example, a value differing by ±14%, ±10%, ±5%, ±2%, or ±1%, would satisfy the definition of about.

As used in this specification and the appended claims, the term "substrate" or "wafer" refers to a surface, or portion of a surface, upon which a process acts. It will also be understood by those skilled in the art that reference to a substrate can refer to only a portion of the substrate unless the context clearly indicates otherwise. Additionally, reference to depositing on a substrate can mean both a bare substrate and a substrate with one or more films or features deposited or formed thereon.

A "substrate" or "substrate surface", as used herein, refers to any portion of a substrate or portion of a material surface formed on a substrate upon which film processing is performed. For example, a substrate surface on which processing can be performed includes materials such as silicon, silicon oxide, silicon nitride, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus, for example, where a film/layer or partial film/layer has been deposited onto a substrate surface, the exposed surface of the newly deposited film/layer becomes the substrate. Substrates may have various dimensions, such as 200 mm or 300 mm diameter wafers, as well as rectangular or square panes. In some embodiments, the substrate comprises a rigid discrete material.

As used herein, the term "on" indicates that there is direct contact between elements. The term "directly on" indicates that there is direct contact between elements with no intervening elements.

As used herein, the terms "reactive compound", "reactive gas", "reactive species", "precursor", "process gas" and the like are used interchangeably to mean a substance with a species capable of reacting with the substrate or material on the substrate in a surface reaction (e.g., chemisorption, oxidation, reduction, cycloaddition). The substrate, or portion of the substrate, is exposed sequentially to the two or more reactive compounds which are introduced into a reaction zone of a processing chamber.

As used herein, the term "purge" or "purging" includes any suitable purge process that removes unreacted precursor, reaction products and by-products from the process region. The suitable purge process includes moving the substrate through a gas curtain to a portion or sector of the processing region that contains none or substantially none of the reactant. In one or more embodiments, purging the processing chamber comprises applying a vacuum. In some embodiments, purging the processing region comprises flowing a purge gas over the substrate. In some embodiments, the purge process comprises flowing an inert gas. In one or more embodiments, the purge gas is selected from one or more of nitrogen ($N_2$), helium (He), and argon (Ar). In some embodiments, a reactive species is purged from the reaction chamber for a time duration in a range of from 0.1 seconds to 30 seconds, from 0.1 seconds to 10 seconds, from 0.1 seconds to 5 seconds, from 0.5 seconds to 30 seconds, from 0.5 seconds to 10 seconds, from 0.5 seconds to 5 seconds, from 1 seconds to 30 seconds, from 1 seconds to 10 seconds, from 1 seconds to 5 seconds, from 5 seconds to 30 seconds, from 5 seconds to 10 seconds or from 10 seconds to 30 seconds before exposing the substrate to the second reactive species.

Carbon-containing passivation layers may be deposited during semiconductor device manufacturing for a number of structures and processes, including as a mask material, an etch resistant material, and a trench fill material, among other applications. More specific examples of applications for carbon-containing materials include the formation of hot implant hard masks, metal gate (MG)-cut hard masks, metal gate fabrication, and reverse tone patterning, self-aligned patterning, among others. The present technology includes the selective formation of these carbon-containing materials on metal/metallic surfaces using ASD.

Embodiments of the present technology include deposition methods to deposit a carbon-containing passivation precursor selectively on a metal/metallic surface over a non-metal/non-metallic or dielectric surface. Exemplary methods may include providing a deposition precursor to a metal/metallic surface of a semiconductor substrate, where the precursor forms a monolayer on the surface. During or after the formation of the monolayer, unbound deposition effluents, which may include unbound molecules of the first deposition precursor, may be removed from a processing region in which the semiconductor substrate is exposed. The semiconductor substrate now has a passivation precursor bound to the metal/metallic surface of the semiconductor substrate, and no or less passivation precursor bound to the non-metal surface. The bound passivation precursor forms a layer which may then be annealed, or plasma treated to further modify the layer on the metal/metallic surface of the semiconductor substrate.

One or more embodiments provides solutions to problems with conventional methods of forming a passivation layer on a semiconductor substrate. For example, the present technology may utilize carbenes, including cyclic alkyl amino carbenes (CAACs). Carbenes form advantageously strong binding interactions to metals, thus yielding a passivation layer that is both thermally and chemically stable relative to layers formed using many non-carbene passivation precursors.

However, it is known that carbenes, including CAACs, are challenging to isolate in their pure forms and difficult to handle due to their inherently high reactivity. The present technology provides solutions to the challenges of working with carbenes by providing the carbenes as stable metal precursors into the processing chamber. The stable metal precursors then undergo a transmetallation reaction in situ with the metal/metallic surface in order to directly deposit CAACs to form an ultra-stable passivation layer on the metal/metallic surface.

Furthermore, some methods of depositing carbon-containing passivation precursors on metal/metallic surfaces may utilize precursors containing halogen-metal bonds. The presence of halogen-metal bonds in a passivation layer on a metal/metallic surface has certain disadvantages, including contributing to corrosion of the metal/metallic surface. In some embodiments, the present technology overcomes these problems by introducing stable carbene species without the use of halogen-metal bonds.

One or more embodiments further advantageously provides solutions to problems with conventional plasma deposition methods of forming a passivation layer on a semiconductor substrate. Conventional plasma deposition methods such as plasma-enhanced chemical-vapor-deposition (PECVD) and high-density-plasma chemical-vapor-deposition (HDPCVD) often create ion sputtering that causes damage to substrate features on the semiconductor substrate and can also create re-sputtered ions and other species that can cause defects in the deposited carbon-containing layer. In addition, they often deposit the material unevenly in and around substrate features, creating voids in and around substrate trenches and steps, and uneven surfaces in planar substrate regions. The present technology may form a carbon-containing passivation layer with a high level of conformity in narrow substrate features (e.g., dimension widths less than about 25 nm) and high aspect ratios (e.g., AR of 10:1 or more) without the need for plasmas that can damage the substrate feature during deposition.

The embodiments of the disclosure are described by way of the Figures, which illustrate devices (e.g., transistors) and methods for forming semiconductor structures in accordance with one or more embodiments of the disclosure. The methods shown are merely illustrative possible uses for the disclosed methods, and the skilled artisan will recognize that the disclosed methods are not limited to the illustrated applications.

Figure 1B:
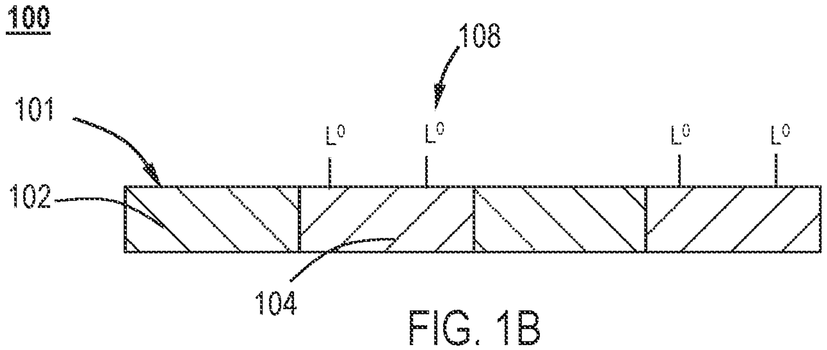
FIG. 1B illustrates a cross-sectional view of a substrate and a precursor selectively binding to a metal surface of the substrate according to one or more embodiments.

FIGS. 1A-1B illustrate cross-sectional views of a semiconductor substrate 100 being processed according to the method of one or more embodiments. Referring to FIG. 1A, in one or more embodiments, a semiconductor substrate 100 includes a semiconductor substrate surface 101. The semiconductor substrate surface 101 includes a metal surface 104 and a non-metal surface 102. In some embodiments, the non-metal surface 102 comprises a dielectric surface. In some embodiments, the non-metal surface 102 comprises one or more of a dielectric surface, a semiconductor surface, a non-metal surface, or a metal surface where the metal is different from the metal of the metal surface 104.

A "metal," as used herein, refers to metal, metal alloy, metal oxide, metal nitride, or combination thereof. A "metal surface," "metallic surface," or "metal layer" as used herein, refers to any portion of a substrate or portion of a material surface formed with the metal. The metal surface may be exposed to a pretreatment process to polish, coat, dope, etch, reduce, oxidize, hydroxylate, anneal, UV cure, e-beam cure and/or bake the substrate. In addition to the pretreatment directly on the metal surface itself, any of the metal surface treatment disclosed may also be performed on an underlayer metal surface as disclosed in more detail below, and the term "metal surface" is intended to include such underlayer as the context indicates. Thus, for example, where a film/layer or partial film/layer has been deposited onto the metal surface, the exposed surface of the newly deposited film/layer becomes the metal surface.

In one or more embodiments, the metal surface 104 comprises a metal, a metal alloy, a metal oxide, a metal nitride, or a combination thereof. Non-limiting examples of metal include copper (Cu), cobalt (Co), nickel (Ni), tungsten (W), ruthenium (Ru), rhodium (Rh), palladium (Pd), iridium (Ir), chromium (Cr), iron (Fe), platinum (Pt), gold (Au), silver (Ag), molybdenum (Mo), manganese (Mn), gallium (Ga), indium (In), tungsten (W), titanium (Ti), tantalum (Ta), aluminum (Al), nickel (Ni), oxides thereof, nitrides thereof, or combinations thereof.

In specific embodiments, the metal surface 104 may comprise a metal M', where M' is selected from the group consisting of ruthenium (Ru), rhodium (Rh), palladium (Pd), iridium (Ir), platinum (Pt), gold (Au), manganese (Mn), iron (Fe), cobalt (Co), nickel (Ni), molybdenum (Mo), titanium (Ti), tantalum (Ta), and tungsten (W).

A "dielectric surface," as used herein, refers to any portion of a substrate or portion of a material surface formed with the dielectric material. Non-limiting examples of dielectric material include silicon oxide ($SiO_x$), silicon nitride ($Si_xN_y$), silicon (Si), silicon oxynitride (SiON), carbides, oxycarbides, nitrides, oxynitrides, oxycarbonitrides, polymers, phosphosilicate glass, fluorosilicate (SiOF) glass, organosilicate glass (SiOCH), aluminum oxide ($AlO_x$), hafnium oxide ($HfO_x$), zirconium oxide ($ZrO_2$), titanium oxide ($TiO_x$), titanium nitride (TiN), tantalum oxide ($Ta_xO_5$), yttrium oxide ($Y_2O_3$), lanthanum oxide ($La_2O_3$), aluminum nitride (AlN), magnesium oxide (MgO), calcium fluoride ($CaF_2$), lithium fluoride (LiF), strontium oxide (SrO), silicon carbide (SiC), barium oxide (BaO), hafnium silicate ($HfSiO_4$), lanthanum aluminate ($LaAlO_3$), niobium pentoxide ($Nb_2O_5$), barium titanate ($BaTiO_3$), strontium titanate ($SrTiO_3$), bismuth titanate ($Bi_4Ti_3O_{12}$), lead zirconium titanate ($Pb(Zr, Ti)O_3$), calcium copper titanate ($CaCu_3Ti_4O_{12}$), lithium niobate ($LiNbO_3$), barium titanate ($BaTiO_3$), and potassium niobate ($KNbO_3$). In one or more specific embodiments, the non-metal surface 104 comprises one or more of silicon oxide ($SiO_x$), silicon oxycarbide (SiOC), silicon oxycarbonitride (SiOCN), silicon nitride (SiN), silicon oxynitride (SiON), silicon (Si), germanium (Ge), silicon germanium (SiGe), silicon carbide (SiC), indium gallium zinc oxide (InGaZnO), aluminum oxide ($AlO_x$), aluminum nitride (AlN), and hafnium oxide ($HfO_x$).

According to some embodiments of the methods described herein, the metal surface 104 may be exposed to a precursor such that a passivation layer is formed on the metal surface 104.

Referring to FIGS. 1A and 1B, in some embodiments, one or more first ligand 106 (also denoted as "$L^2$") may be bound to the metal surface 104. The metal surface 104 then undergoes a transmetallation reaction with a precursor to replace the first ligand 106, e.g., ligand $L^2$, with a second ligand 108 (also denoted as $L^0$). The ligand $L^2$ may be any ligand suitable for binding to a metal center. In some embodiments, $L^2$ is a neutral ligand. In some embodiments, $L^2$ is a neutral ligand selected from the group consisting of (tri) alkylphosphine, (tri) alkylamine, vinylsilane, substituted acetylenes, substituted alkenes, cyclooctadiene, and cyclohexadiene. In some embodiments, $L^2$ is bound to the metal M' of the metal surface 104.

In one or more embodiments, the precursor may be any precursor suitable for a transmetallation reaction, In some embodiments, the precursor may have a general formula (I):

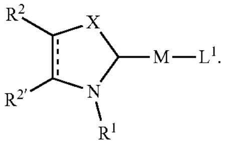

(I)

In some embodiments, $R^1$ may be selected from the group consisting of substituted or unsubstituted linear or branched $C_{1-24}$ alkyl, substituted or unsubstituted $C_{5-7}$ cyclic alkyl, substituted or unsubstituted phenyl, and benzyl substituted with alkyl, alkoxy, or thio. In some embodiments, $R^2$ and $R^2$ are each independently selected from the group consisting of substituted or unsubstituted linear or branched $C_{1-24}$ alkyl, substituted or unsubstituted $C_{5-7}$ cyclic alkyl, substituted or unsubstituted phenyl, and benzyl substituted with alkyl, alkoxy, or thio. The dashed line in general formula (I) means that the indicated bond may be a single bond or a double bond.

In some embodiments, X is selected from the group consisting of $NR^3$, $CR^4R^5$, O, and S, wherein $R^3$, $R^4$ and $R^5$ each independently comprise H or substituted or unsubstituted linear or branched $C_{1-24}$ alkyl.

In some embodiments, M comprises a metal. In one or more embodiments, the metal M may be any suitable metal that has a chemical hardness greater than the chemical hardness of the metal M' of the metal surface 104. In one or more embodiments, the metal M is selected from the group consisting of copper (Cu) and silver (Ag).

In some embodiments, $L^1$ comprises an anionic ligand.

As used herein, the term "alkyl" or "alk," alone or as part of another group, includes both straight and branched chain hydrocarbons, containing 1 to 24 carbons, or 1 to 12 carbon atoms, in the normal chain, such as methyl, ethyl, propyl, isopropyl, butyl, t-butyl, isobutyl, pentyl, hexyl, isohexyl, heptyl, 4,4-dimethylpentyl, octyl, 2,2,4-trimethyl-pentyl, nonyl, decyl, undecyl, dodecyl, the various branched chain isomers thereof, and the like. Such groups may optionally include up to 1 to 4 substituents. The alkyl may be substituted or unsubstituted.

The term "$C_{5-7}$ cyclic alkyl" as used herein includes all alkyl groups that include a ring having 5, 6, or 7 atoms.

The alkyl groups, including cyclic alkyl groups, may optionally include up to 1 to 4 substituents such as halo, for example F, Br, Cl, or I, or $CF_3$, alkyl, alkoxy, aryl, aryloxy, aryl(aryl) or diaryl, arylalkyl, arylalkyloxy, alkenyl, cycloalkyl, cycloalkylalkyl, cycloalkylalkyloxy, amino, hydroxy, hydroxyalkyl, acyl, heteroaryl, heteroaryloxy, heteroarylalkyl, heteroarylalkoxy, aryloxyalkyl, alkylthio, arylalkylthio, aryloxyaryl, alkylamido, alkanoylamino, arylcarbonylamino, nitro, cyano, thiol, haloalkyl, trihaloalkyl, and/or alkylthio, and the like.

As used herein, the term "alkene" or "alkenyl" refers to straight or branched chain radicals of 2 to 24 carbons, or 2 to 12 carbons, and 1 to 8 carbons in the normal chain, which include one to six double bonds in the normal chain, such as vinyl, 2-propenyl, 3-butenyl, 2-butenyl, 4-pentenyl, 3-pentenyl, 2-hexenyl, 3-hexenyl, 2-heptenyl, 3-heptenyl, 4-heptenyl, 3-octenyl, 3-nonenyl, 4-decenyl, 3-undecenyl, 4-dodecenyl, 4,8,12-tetradecatrienyl, and the like, and which may be optionally substituted with 1 to 4 substituents, namely, halogen, haloalkyl, alkyl, alkoxy, alkenyl, alkynyl, aryl, arylalkyl, cycloalkyl, amino, hydroxy, heteroaryl, cycloheteroalkyl, alkanoylamino, alkylamido, arylcarbonylamino, nitro, cyano, thiol, alkylthio, and/or any of the alkyl substituents set out herein.

As used herein, the term "alkynyl" refers to straight or branched chain radicals of 2 to 24 carbons, or 2 to 12 carbons, or 2 to 8 carbons in the normal chain, which include one triple bond in the normal chain, such as 2-propynyl, 3-butynyl, 2-butynyl, 4-pentynyl, 3-pentynyl, 2-hexynyl, 3-hexynyl, 2-heptynyl, 3-heptynyl, 4-heptynyl, 3-octynyl, 3-nonynyl, 4-decynyl, 3-undecynyl, 4-dodecynyl, and the like, and which may be optionally substituted with 1 to 4 substituents, namely, halogen, haloalkyl, alkyl, alkoxy, alkenyl, alkynyl, aryl, arylalkyl, cycloalkyl, amino, heteroaryl, cycloheteroalkyl, hydroxy, alkanoylamino, alkylamido, arylcarbonylamino, nitro, cyano, thiol, and/or alkylthio, and/or any of the alkyl substituents set out herein.

As used herein, the term "aryl" refers to monocyclic and bicyclic aromatic groups containing 6 to 10 carbons in the ring portion (such as phenyl, biphenyl or naphthyl, including 1-naphthyl and 2-naphthyl) and may optionally include 1 to 3 additional rings fused to a carbocyclic ring or a heterocyclic ring (such as aryl, cycloalkyl, heteroaryl, or cycloheteroalkyl rings). The aryl group may be optionally substituted through available carbon atoms with 1, 2, or 3 substituents, for example, hydrogen, halo, haloalkyl, alkyl, haloalkyl, alkoxy, haloalkoxy, alkenyl, trifluoromethyl, trifluoromethoxy, alkynyl, and the like.

The term "halogen" or "halo" as used herein alone or as part of another group refers to chlorine, bromine, fluorine, and iodine as well as $CF_3$.

In some embodiments, the precursors used in the present disclosure do not include halogens. In some embodiments, the precursor is substantially free of metal-halogen direct coordination. As used herein, the term "substantially free" means that there is less than about 5%, including less than about 4%, less than about 3%, less than about 2%, less than about 1%, and less than about 0.5% of metal-halogen direct coordination, on an atomic basis, in the precursor.

In some embodiments, the precursor may displace the ligand 106 from the metal surface 104, and a second ligand 108 ("$L^0$") may bind on the metal surface 104, as illustrated in FIG. 1B. The second ligand 108 may comprise the precursor or a portion thereof.

Referring to FIG. 1B, the exposure of the precursor having general formula (I) may comprise a transmetallation reaction. For example, first ligand 106 ("$L^2$") may be exchanged by second ligand 108 ("$L^0$") on the metal surface 104 as a result of exposing the semiconductor surface 101 to the precursor. More specifically, the transmetallation may occur between M of the precursor and a metal M' of the metal surface 104. In some embodiments, $L^0$ may comprise a portion of the precursor, such as the portion excluding -M-$L^1$; for example, $L^0$ may have a general formula:

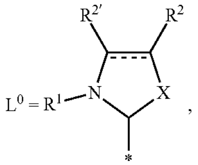

where the symbol "*" corresponds to an attachment point to a metal surface, such as the metal surface 104. The dashed line in the shown general structure for $L^0$ means that the indicated bond may be a single bond or a double bond. Molecules of the precursor may be introduced into the substrate processing chamber, including in the vapor phase, and may react with metal of the metal surface 104 that is bound to first ligand 106 ("$L^2$"). The reactions may continue until most, or all of the first ligand 106 is removed from the metal surface. In some embodiments, all or most of first ligand 106 is exchanged by a transmetallated second ligand $L^0$.

As a result of the transmetallation, one or more side product may be formed. The side product may have the general formula $L^2$-M-$L^1$, wherein $L^2$ is the first ligand and $L^1$ is the anionic ligand. Generally, the side product is purged from the processing chamber.

In one or more embodiments, the substrate or the processing chamber is optionally purged to remove unreacted precursor, reaction products and by-products. As used in this manner, the term "processing chamber" also includes portions of a processing chamber adjacent the substrate surface without encompassing the complete interior volume of the processing chamber. For example, in a sector of a spatially separated processing chamber, the portion of the processing chamber adjacent the substrate surface is purged of the silicon-chalcogen precursor by any suitable technique including, but not limited to, moving the substrate through a gas curtain to a portion or sector of the processing chamber that contains none or substantially none of the silicon-chalcogen precursor. In some embodiments, purging the processing chamber comprises applying a vacuum. In some embodiments, purging the processing chamber comprises flowing a purge gas over the substrate. In some embodiments, the portion of the processing chamber refers to a micro-volume or small volume process station within a processing chamber. The term "adjacent" referring to the substrate surface means the physical space next to the surface of the substrate which can provide sufficient space for a surface reaction (e.g., precursor adsorption) to occur. In one or more embodiments, the purge gas is selected from one or more of nitrogen ($N^2$), helium (He), neon (Ne), and argon (Ar).

In some embodiments, the metal surface 104 may include a metal M' that is chemically softer than the metal M included in the precursor of general formula (I). Without being bound by theory, the carbene ligand $L^0$ is understood to be relatively soft according to Hard and Soft Acid Base (HSAB) Theory, such that when M' is softer than M, the CAAC ligand preferentially coordinates with M' of metal surface 104 than with M of the precursor. This may provide a thermodynamic driving force for transmetallation to occur.

Thus, in some embodiments, the metal M in general formula (I) may be selected from the group consisting of copper (Cu) and silver (Ag).

In some embodiments, the anionic ligand $L^1$ in general formula (I) is selected from the group consisting of diketonate, ketoiminate, diiminate, acetate, trifluoroacetate, cyclopentadienyl, hexamethyldisilylamide, aminoalkoxide, and thiolate.

In some embodiments, $R^2$ and $R^{2'}$ in general formula (I) together may form an aromatic ring, such as a substituted or unsubstituted phenyl ring. In some embodiments, the precursor of formula (I) may have a general formula (II):

(II)

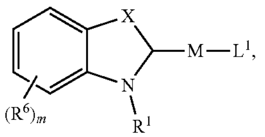

where, as described above with respect to precursor of general formula (I), $R^1$ may be selected from the group consisting of substituted or unsubstituted linear or branched phenyl, and benzyl substituted with alkyl, alkoxy, or thio; M comprises a metal, $L^1$comprises an anionic ligand, and wherein $R^6$ is selected from the group consisting of $C_{1-24}$ alkyl, $C_{1-24}$ alkoxy, and $C_{1-24}$ thio. Further, m in general formula (II) is an integer in a range of from 1 to 4; for example, m may be 1, 2, 3, or 4. In one or more embodiments, the metal M may be any suitable metal that has a chemical hardness greater than the chemical hardness of the metal M' of the metal surface 104. In one or more embodiments, the metal M is selected from the group consisting of copper (Cu) and silver (Ag).

In some embodiments, the precursor may have a general formula (III):

(III)

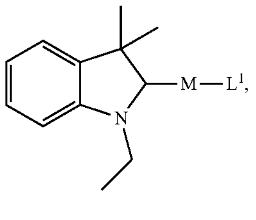

where, as described above with respect to the precursor of general formula (I) and the precursor of general formula (II), M comprises a metal and $L^1$ comprises an anionic ligand. In one or more embodiments, the metal M may be any suitable metal that has a chemical hardness greater than the chemical hardness of the metal M' of the metal surface 104. In one or more embodiments, the metal M is selected from the group consisting of copper (Cu) and silver (Ag).

In some embodiments, the precursor may have a structure as shown in Table
TABLE 1
| Structures of precursors and precursor transmetallation side-products according to some embodiments. | | |
|---|---|---|
| | Precursor | Precursor side-product |
| 1 | 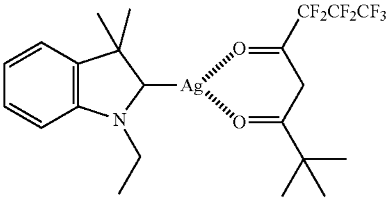 | 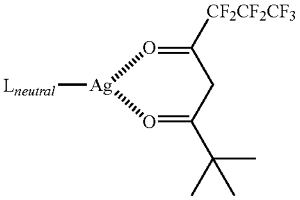 |
| 2 | 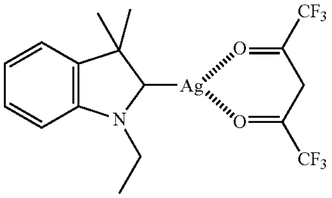 | 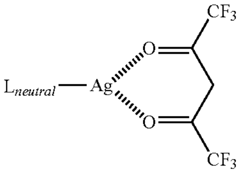 |
| 3 | 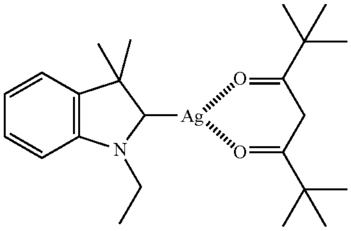 | 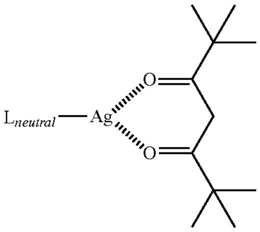 |
| 4 | 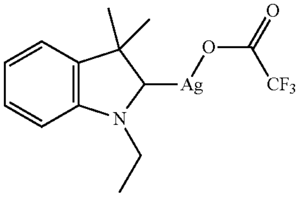 | 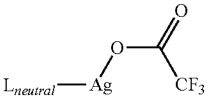 |
| 5 | 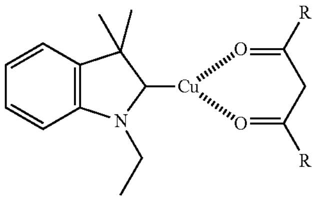 | 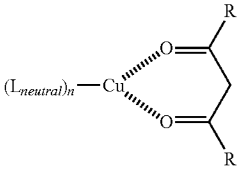 |
| 6 | 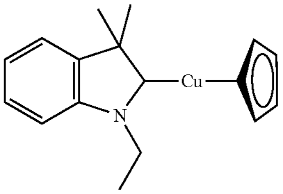 | 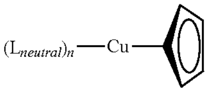 |

TABLE 1-continued
Structures of precursors and precursor transmetallation side-products according to some embodiments.
| | Precursor | Precursor side-product |
|---|---|---|
| 7 | 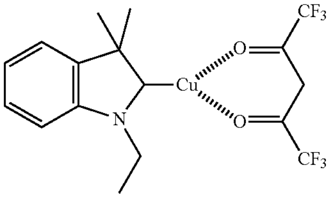 | 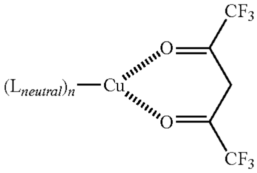 |
| 8 | 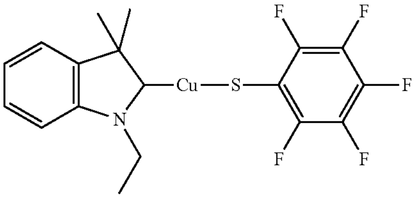 | 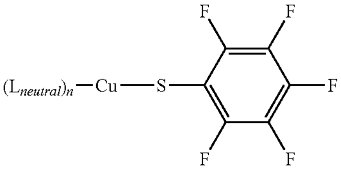 |
| 9 | 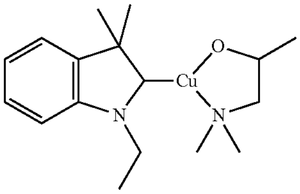 | 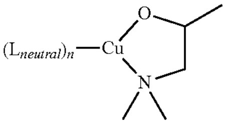 |
| 10 | 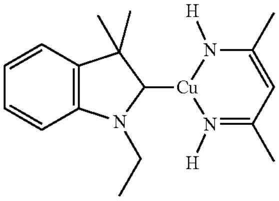 | 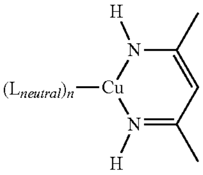 |
| 11 | 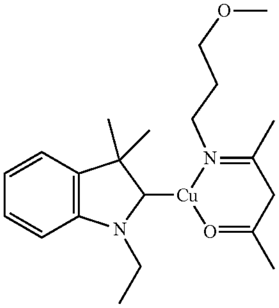 | 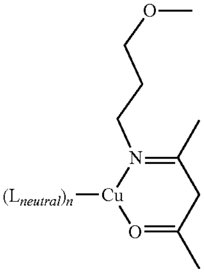 |
| 12 | 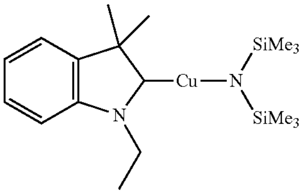 | 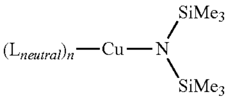 |

TABLE 1-continued

| Structures of precursors and precursor transmetallation side-products according to some embodiments. | | |
|---|---|---|
| | Precursor | Precursor side-product |
| 13 | 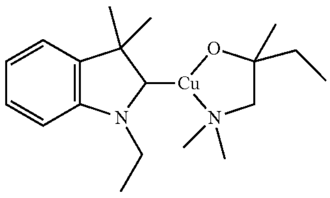 | 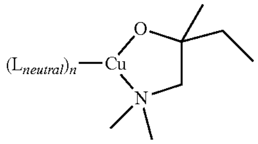 |

In one or more embodiments, the precursor may remain in the substrate processing region for a period of time to nearly, or completely, form the passivation layer on the metal surface. The precursors may be delivered in alternating pulses to grow the passivation layer. In some embodiments, the pulse times of the precursor may be greater than or equal to 0.1 seconds, greater than or equal to 1 second, greater than or equal to 2 seconds, greater than or equal to 3 seconds, greater than or equal to 4 seconds, greater than or equal to 5 seconds, greater than or equal to 10 seconds, greater than or equal to 20 seconds, greater than or equal to 40 seconds, greater than or equal to 60 seconds, greater than or equal to 80 seconds, greater than or equal to 100 seconds, or more.

In some embodiments, the transmetallation process is conducted at a temperature in a range of from about 100° C. to about 350° C. For example, the transmetallation process may be conducted from about 100° C. to about 200° C., or from about 200°° C. to about 300° C., or from about 250° C. to about 350° C. In some embodiments, the transmetallation process is conducted from about 100° C. to about 150° C., from about 150° C. to about 200° C., from about 200° C. to about 250° C., from about 250° C. to about 300° C., or from about 300° C. to about 350° C.

Without being bound by theory, it is thought that the passivation layer formed from the precursor having general formula (I) forms highly stable bonds to the metal surface due to the high reactivity of carbenes, including CAACs, to metal ligands.

In some embodiments, the methods of depositing a passivation layer on a semiconductor substrate include exposing a semiconductor substrate having a metal layer thereon to a neutral ligand $L^2$ to form a complex of the metal layer and the neutral ligand $L^2$, wherein $L^2$ comprises one or more of (tri)alkylphosphine, (tri)alkylamine, vinylsilane, substituted acetylenes, substituted alkenes, cyclooctadiene, and cyclohexadiene. In some embodiments, the methods also include exposing the complex of the metal layer and the neutral ligand $L^2$ to a precursor to form a passivation layer on the metal layer, the precursor having a general formula (I).

Some embodiments may include one or more optional operations of purging the semiconductor substrate. The purging may purge, or remove, one or more ligand or precursor, or effluent or side product of a ligand or precursor, from the substrate processing region. The effluents may be removed by pumping them out of the substrate processing region for a period of time ranging from about 10 seconds to about 100 seconds. Additional exemplary time ranges may include about 20 seconds to about 50 seconds, and 25 seconds to about 45 seconds, among other exemplary time ranges. In some embodiments, however, increased purge time may begin to remove reactive sites, which may reduce uniform formation. Accordingly, in some embodiments the purge may be performed for less than or equal to 60 seconds and may be performed for less than or equal to 50 seconds, less than or equal to 40 seconds, less than or equal to 30 seconds, or less. In some embodiments, a purge gas may be introduced to the substrate processing region to assist in the removal of the effluents. In some embodiments, the purging may be conducted by flowing a purge gas over the semiconductor substrate. Exemplary examples of purge gases include argon (Ar), helium (He), hydrogen ($H_2$), neon (Ne), and nitrogen ($N_2$), among other purge gases.

The methods of depositing a passivation layer may selectively deposit the passivation layer on the metal surface of the semiconductor substrate, such that none or less of the passivation layer is deposited on the non-metal or dielectric surface, or surface of a different metal than the selected surface, of the semiconductor substrate.

As used herein, the phrase "selectively over," or similar phrases, means that the subject material is deposited on the stated surface to a greater extent than on another surface. In some embodiments, "selectively" means that the subject material forms on the selective surface at a rate greater than or equal to about 10×, 15×, 20×, 25×, 30×, 35×, 40×, 45×or 50×the rate of formation on the non-selected surface. In some embodiments, the passivation layer forms on the metal surface 104 and does not form on the non-metal surface 102 with a selectivity ratio of at least about 10:1, or at least about 100:1, or at least about 1000:1.

Referring to FIGS. 2A-3B, the semiconductor substrate on which the passivation layer is deposited may comprise one or more feature 107. For example, a feature 107 may be, or may include, a trench structure, a via structure, or an aperture formed within the substrate. Although the substrate features may be characterized by any shapes or sizes, in some embodiments the substrate features may be characterized by higher aspect ratios, or a ratio of a depth of the feature to a width across the feature. For example, in some embodiments, substrate features may be characterized by aspect ratios greater than or equal to 5:1, and may be characterized by aspect ratios greater than or equal to 10:1, greater than or equal to 15:1, greater than or equal to 20:1, greater than or equal to 25:1, greater than or equal to 30:1, greater than or equal to 40:1, greater than or equal to 50:1, or greater. Additionally, the features may be characterized by narrow widths or diameters across the feature including between two sidewalls, such as a dimension less than or equal to 25 nm, and may be characterized by a width across the feature of less than or equal to 15 nm, less than or equal to 12 nm, less than or equal to 10 nm, less than or equal to 9 nm, less than or equal to 8 nm, less than or equal to 7 nm, less than or equal to 6 nm, less than or equal to 5 nm, or less.

Figure 2A:
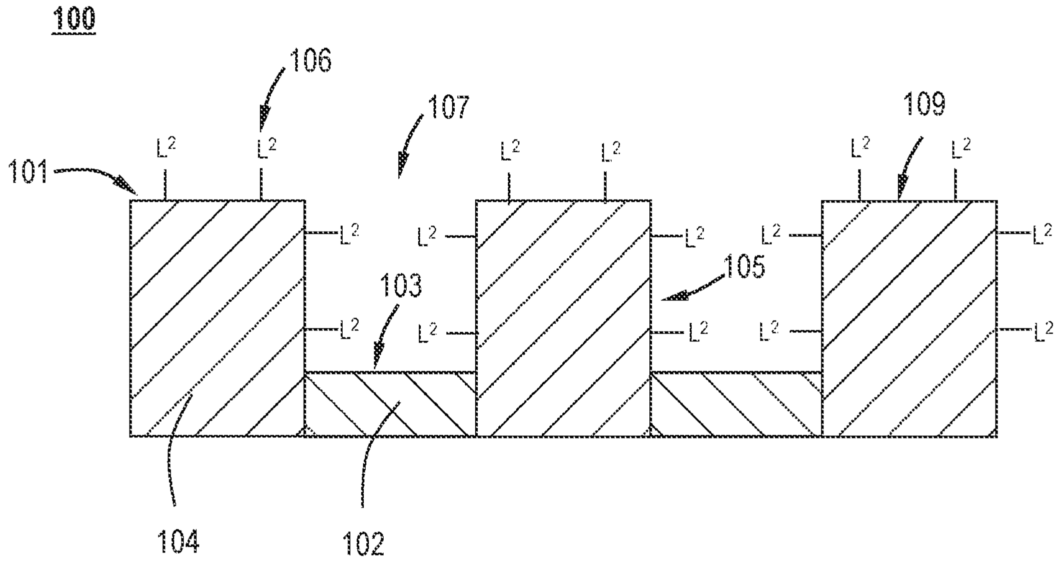
FIG. 2A illustrates a cross-sectional view of a substrate and a precursor selectively binding to a metal surface of the substrate according to one or more embodiments.
Figure 2B:
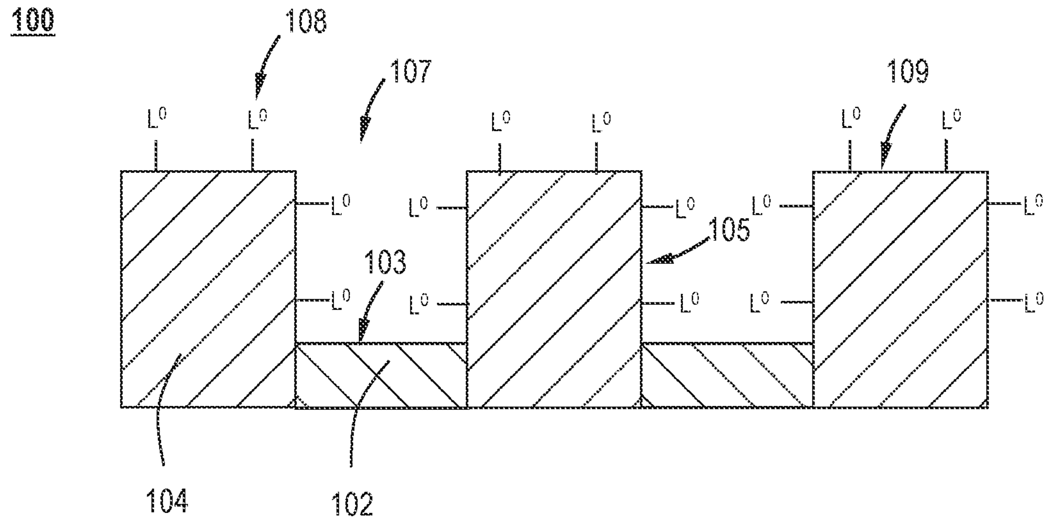
FIG. 2B illustrates a cross-sectional view of a substrate and a precursor selectively binding to a metal surface of the substrate according to one or more embodiments.

FIGS. 2A-2B illustrate cross-sectional views of a semiconductor substrate comprising a trench feature 107, the trench feature being formed from the different spatial dimensions of metal surface 104 relative to non-metal surface 102. The side walls 105 and top 109 of the trench feature 107 are formed by the metal surface 104, and the base 103 of the trench feature 107 is formed by the non-metal surface 102. As shown in FIG. 2A, one or more ligands 106 ("$L^2$") may be bound selectively to the metal surface 104 of the semiconductor substrate surface 101. Upon exposure of the semiconductor substrate to a precursor, first ligand 106 may be displaced by a second ligand 108 ("$L^0$"), wherein $L^0$ may comprise the precursor or a part thereof, and wherein the displacement may occur by a transmetallation reaction. The ligand $L^0$ is also bound selectively to the metal surface 104 over the non-metal surface 102, thus in this example, a passivation layer is selectively deposited on the walls and top of trench feature 107. As used herein, the term "passivation layer" refers to a plurality of second ligand 108 formed on the metal surface 104, including the side wall 105 surface and top surface 109.

Figure 3A:
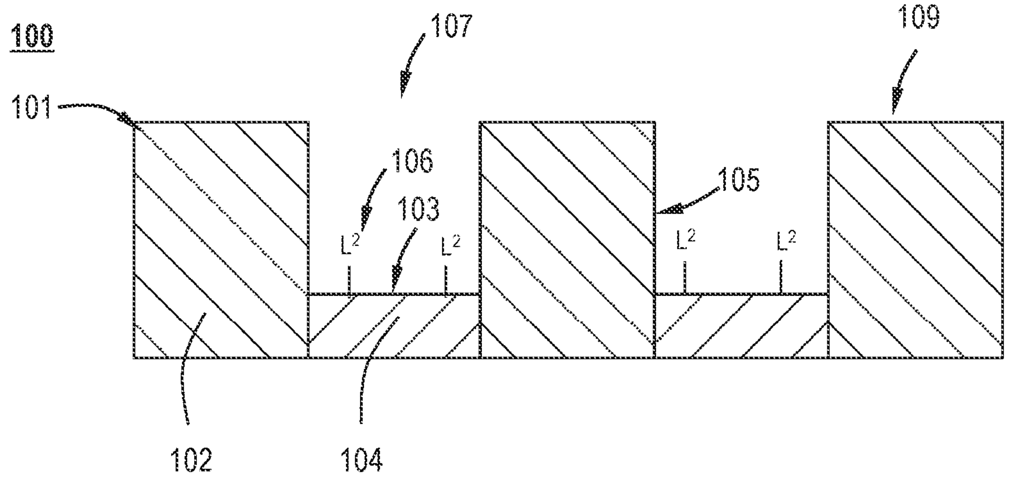
FIG. 3A illustrates a cross-sectional view of a substrate and a precursor selectively binding to a metal surface of the substrate according to one or more embodiments.
Figure 3B:
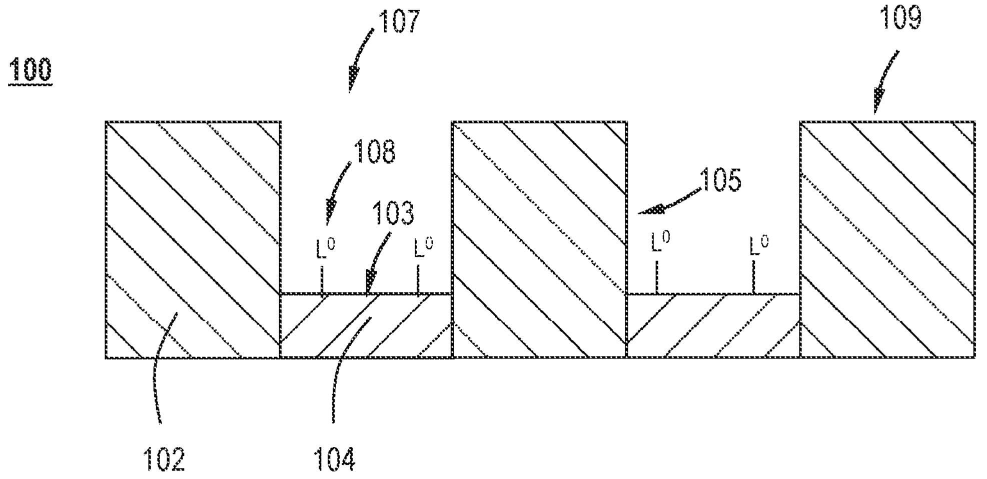
FIG. 3B illustrates a cross-sectional view of a substrate and a precursor selectively binding to a metal surface of the substrate according to one or more embodiments.

As another example, FIGS. 3A-3B illustrate cross-sectional views of a semiconductor substrate comprising a trench feature 107. Referring to these figures, the base 103 of the trench feature 107 is formed by the metal surface 104 and the side walls 105 and top 109 of the trench feature 107 are formed by the non-metal surface 102. As illustrated in FIG. 3A, one or more first ligands 106 ("$L^2$") may be bound selectively to the metal surface 104 of the semiconductor substrate surface 101. Upon exposure of the semiconductor substrate to a precursor, ligand $L^2$ may be displaced by a second ligand 108 ("$L^0$"), wherein $L^0$ may comprise all or part of the precursor, and wherein the displacement may occur by a transmetallation reaction. The ligand $L^0$ is also bound selectively to the metal surface 104 over the non-metal surface 102, thus in this example, a passivation layer is selectively deposited on the base 103 of trench feature 107 on the metal surface 104.

Figure 4:
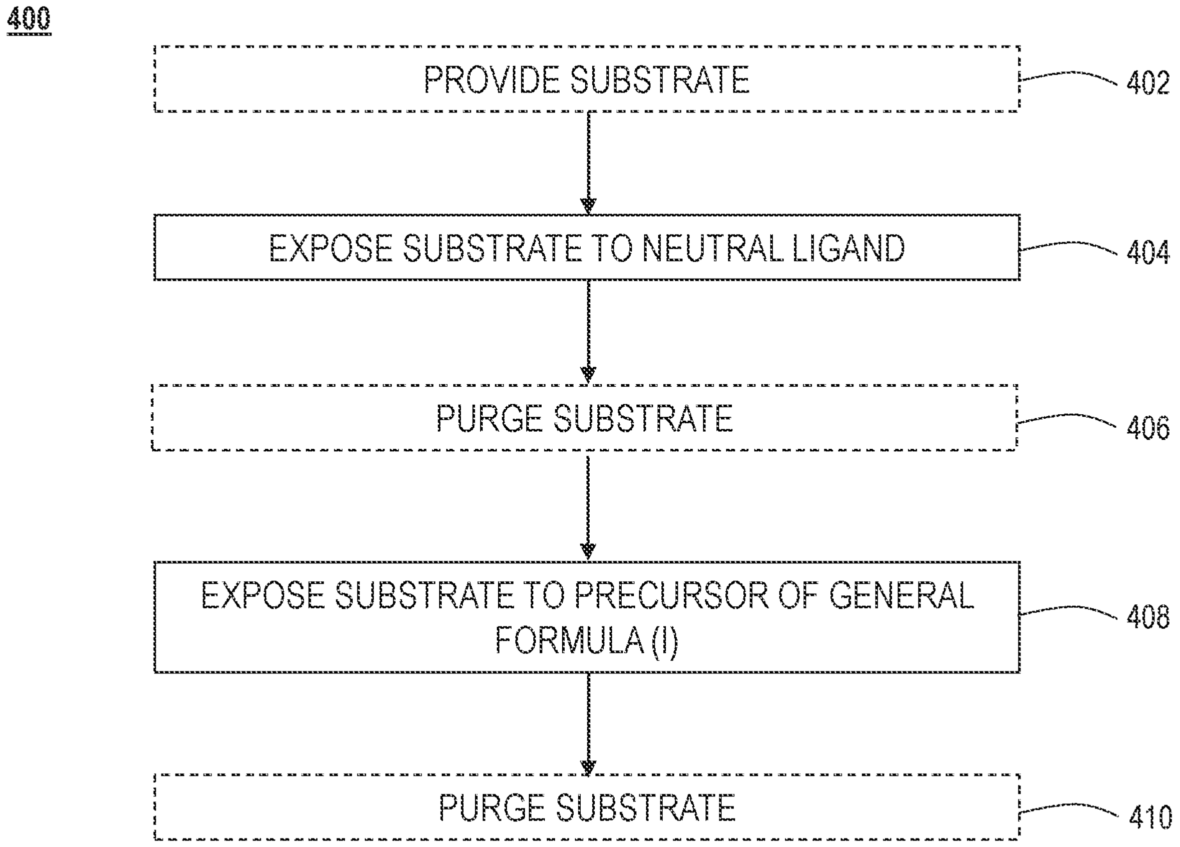
FIG. 4 illustrates a process flow diagram of a method of selectively depositing a passivation layer on a substrate according to one or more embodiments.

In some embodiments, the methods described herein are illustrated by a flow diagram as shown in FIG. 4. Referring to FIG. 4, in one or more embodiments, the method 400 includes an operation 402, where a substrate is optionally provided to the processing chamber.

As used herein, the term "provided" means that the substrate is made available for processing (e.g., positioned in a processing chamber). As used herein, the term "processing chamber" also includes portions of a processing chamber adjacent to the substrate surface without encompassing the complete interior volume of the processing chamber.

In one or more embodiments, at operation 404, the substrate is exposed to a neutral ligand. The neutral ligand may coordinate to metal in the metal surface 104 selectively over the non-metal surface 102. In some embodiments, the neutral ligand is referred to as first ligand 106 ("$L^2$") as illustrated in FIGS. 1A, 2A, and 3A.

In some embodiments, at operation 406, the substrate is optionally purged. The purging may remove a neutral ligand or neutral ligand effluent from the processing chamber. Purging the processing chamber in operation 406 can be the same process or different process as that described above. Purging the processing chamber, portion of the processing chamber, area adjacent the substrate surface, etc., removes unreacted reactant, reaction products, and by-products from the area adjacent the substrate surface.

In some embodiments, at operation 408, the substrate is exposed to a precursor of general formula (I). In other embodiments, at operation 408, the substrate is exposed to a precursor of general formula (II). In some embodiments, at operation 408, the substrate is exposed to a precursor of general formula (III). The precursor may coordinate to the metal surface 104 of the substrate selectively over the non-metal surface 102. Particularly, in some embodiments, the precursor or a portion thereof may displace the neutral ligand $L^2$ from the metal surface 104, such as by a transmetallation reaction. In some embodiments, the portion of the precursor that displaces the neutral ligand $L^2$ is referred to as second ligand 108 ("$L^0$") as illustrated in FIGS. 1B, 2B, and 3B.

In some embodiments, at operation 410, the substrate is optionally purged. The purging may remove the precursor or precursor effluent from the processing chamber. Purging the processing chamber in operation 410 can be the same process or different process than the purge in operation 406. Purging the processing chamber, portion of the processing chamber, area adjacent the substrate surface, etc., removes unreacted reactant, reaction products, and by-products from the area adjacent the substrate surface. For example, the precursor effluent being purged may be a transmetallation side product from a reaction of the precursor with the neutral ligand on the metal surface, and may have a general formula $L^2$-M-$L^1$.

In some embodiments, prior to performing operation 402 as illustrated in FIG. 4, the substrate surface 101 may optionally be exposed to a pretreatment process to polish, coat, dope, etch, reduce, oxidize, hydroxylate, anneal, UV cure, e-beam cure and/or bake the substrate. In some embodiments, the substrate may be pre-treated with one or more of high temperature annealing, plasma treatment, and gas annealing. Plasma treatment may include treatment with a plasma selected from one or more of hydrogen ($H_2$), oxygen ($O_2$), ammonia ($NH_3$), nitrogen ($N_2$), carbon dioxide ($CO_2$), nitrous oxide ($N_2O$), argon (Ar), and the like. Gas annealing may include annealing in an atmosphere of one or more of hydrogen ($H_2$), oxygen ($O_2$), ozone ($O_3$), nitrous oxide ($N_2O$), water ($H_2O$), hydrogen peroxide ($H_2O_2$), and the like.

In some embodiments, the metal surface 104 is cleaned or pre-treated with a plasma. In some embodiments, the plasma is a conductively coupled plasma (CCP). In some embodiments, the plasma is an inductively coupled plasma (ICP).

In addition to any of the methods described herein on the metal surface 104 itself, in the present disclosure, any of the treatments or pre-treatments disclosed may also be performed on an underlayer metal surface, and the term "dielectric surface" is intended to include such underlayer as the context indicates. Thus, for example, where a film/layer or partial film/layer has been deposited onto the metal surface, the exposed surface of the newly deposited film/layer becomes the metal surface.

In some embodiments, the processing region is in a modular system comprising multiple chambers which perform various functions including substrate center-finding and orientation, degassing, annealing, deposition and/or etching. According to one or more embodiments, the modular system includes at least a first processing chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation, and other substrate processes. By carrying out processes in the processing chamber of a modular system, surface contamination of the substrate with atmospheric impurities can be avoided without oxidation prior to depositing a subsequent film.

According to one or more embodiments, the substrate is continuously under vacuum or "load lock" conditions and is not exposed to ambient air when being moved from one chamber to the next. The transfer chambers are thus under vacuum and are "pumped down" under vacuum pressure. Inert gases may be present in the processing chambers or the transfer chambers. In some embodiments, the inert gas is used to purge or remove some or all of the reactants (e.g., reactant). According to one or more embodiments, the inert gas is injected at the exit of the processing chamber to prevent reactants (e.g., reactant) from moving from the processing chamber to the transfer chamber and/or additional processing chamber. Thus, the flow of inert gas forms a curtain at the exit of the chamber.

The substrate can be processed in single substrate deposition chambers, where a single substrate is loaded, processed, and unloaded before another substrate is processed. The substrate can also be processed in a continuous manner, similar to a conveyer system, in which multiple substrates are individually loaded into a first part of the chamber, move through the chamber, and are unloaded from a second part of the chamber. The shape of the chamber and associated conveyer system can form a straight path or curved path. Additionally, the processing chamber may be a carousel in which multiple substrates are moved about a central axis and are exposed to deposition, etch, annealing, cleaning, etc. processes throughout the carousel path.

During processing, the substrate can be heated or cooled. Such heating or cooling can be accomplished by any suitable means including, but not limited to, changing the temperature of the substrate support, and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated (about the substrate axis) continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

In a spatial ALD process, the reactive gases are flowed into different processing regions within a processing chamber. The different processing regions are separated from adjacent processing regions so that the reactive gases do not mix. The substrate can be moved between the processing regions to separately expose the substrate to the reactive gases. During substrate movement, different portions of the substrate surface, or material on the substrate surface, are exposed to the two or more reactive gases so that any given point on the substrate is substantially not exposed to more than one reactive gas simultaneously. As will be understood by those skilled in the art, there is a possibility that a small portion of the substrate may be exposed to multiple reactive gases simultaneously due to diffusion of the gases within the processing chamber, and that the simultaneous exposure is unintended, unless otherwise specified.

A "pulse" or "dose" as used herein refers to a quantity of a source gas that is intermittently or non-continuously introduced into the process chamber. The quantity of a particular compound within each pulse may vary over time, depending on the duration of the pulse. A particular process gas may include a single compound or a mixture/combination of two or more compounds.

The durations for each pulse/dose are variable and may be adjusted to accommodate, for example, the volume capacity of the processing chamber as well as the capabilities of a vacuum system coupled thereto. Additionally, the dose time of a reactive gas may vary according to the flow rate of the reactive gas, the temperature of the process gas, the type of control valve, the type of process chamber employed, as well as the ability of the components of the process gas to adsorb onto the substrate. Dose times may also vary based upon the type of layer being formed and the geometry of the device being formed. A dose time should be long enough to provide a volume of compound sufficient to adsorb/chemisorb onto substantially the entire surface of the substrate and form a layer of a process gas component thereon.

Once the passivation layer is deposited, the method may optionally include further processing (e.g., bulk deposition of a dielectric film). In some embodiments, the further processing may be an ALD process.

The disclosure provides that the processes may generally be stored in the memory as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor or controller, transforms the general-purpose computer into a specific purpose computer (controller) that controls the chamber operation such that the processes are performed. The process can be stored on non-transitory computer readable medium including instructions, that, when executed by a controller of a substrate processing chamber, causes the substrate processing chamber to perform the operations of: expose a semiconductor substrate having a metal surface thereon to a precursor to form a passivation layer on the metal surface, the precursor having a general formula (I); and, optionally, purge the semiconductor substrate.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of depositing a passivation layer on a semiconductor substrate, the method comprising:

exposing a semiconductor substrate having a metal layer thereon to a precursor to form a passivation layer on the metal layer, the precursor having a general formula (I)

(I)

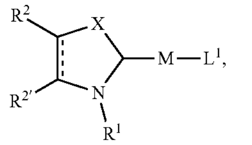

wherein $R^1$ is selected from the group consisting of substituted or unsubstituted linear or branched $C_{1-24}$ alkyl, substituted or unsubstituted $C_{5-7}$ cyclic alkyl, substituted or unsubstituted phenyl, and benzyl substituted with alkyl, alkoxy, or thio;

$R^2$ and $R^{2'}$ are each independently selected from the group consisting of substituted or unsubstituted linear or branched C1-24 alkyl, substituted or unsubstituted $C_{5-7}$ cyclic alkyl, substituted or unsubstituted phenyl, and benzyl substituted with alkyl, alkoxy, or thio;

X is selected from the group consisting of $NR^3$, $CR^4R^5$, O, and S, wherein $R^3$, $R^4$ and $R^5$ each independently comprise H or substituted or unsubstituted linear or branched $C_{1-24}$ alkyl;

M comprises a metal; and $L^1$ comprises an anionic ligand, wherein exposing the semiconductor substrate to the precursor comprises a transmetallation process.

2. The method of claim 1, wherein M is selected from copper (Cu) and silver (Ag).

3. The method of claim 1, wherein the precursor has a general formula (II):

(II)

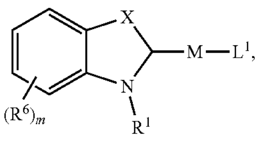

wherein $R^6$ is independently selected from the group consisting of $C_{1-24}$ alkyl, $C_{1-24}$ alkoxy, and $C_{1-24}$ thio, and m is an integer in a range of from 1 to 4.

4. The method of claim 1, wherein the anionic ligand comprises one or more of diketonate, ketoiminate, diiminate, acetate, trifluoroacetate, cyclopentadienyl, hexamethyldisilylamide, aminoalkoxide, and thiolate.

5. The method of claim 1, wherein the metal layer comprises a ligand $L^2$ and a metal M' selected from ruthenium (Ru), rhodium (Rh), palladium (Pd), iridium (Ir), platinum (Pt), gold (Au), manganese (Mn), iron (Fe), cobalt (Co), nickel (Ni), molybdenum (Mo), titanium (Ti), tantalum (Ta), and tungsten (W).

6. The method of claim 5, wherein the metal M' is selected from the group consisting of ruthenium (Ru), rhodium (Rh), palladium (Pd), iridium (Ir), platinum (Pt), and gold (Au).

7. The method of claim 5, wherein the metal M' is selected from the group consisting of manganese (Mn), iron (Fe), cobalt (Co), nickel (Ni), molybdenum (Mo), titanium (Ti), tantalum (Ta), and tungsten (W).

8. The method of claim 5, wherein $L^2$ is a neutral ligand comprising one or more of (tri) alkylphosphine, (tri) alkylamine, vinylsilane, substituted acetylenes, substituted alkenes, cyclooctadiene, and cyclohexadiene.

9. The method of claim 1, further comprising purging the semiconductor substrate.

10. The method of claim 9, wherein purging comprises flowing a purge gas over the semiconductor substrate, the purge gas comprising one or more of argon (Ar), nitrogen, hydrogen, and helium.

11. The method of claim 1, wherein the transmetallation process is conducted at a temperature in a range of from 100° C. to 350° C.

12. A method of depositing a passivation layer on a semiconductor substrate, the method comprising:

exposing a semiconductor substrate having a metal layer thereon to a neutral ligand $L^2$ to form a complex of the metal layer and the neutral ligand $L^2$, wherein the neutral ligand $L^2$ comprises one or more of (tri) alkylphosphine, (tri) alkylamine, vinylsilane, substituted acetylenes, substituted alkenes, cyclooctadiene, and cyclohexadiene;

exposing the complex of the metal layer and the neutral ligand $L^2$ to a precursor to form a passivation layer on the metal layer, the precursor having a general formula (I)

(I)

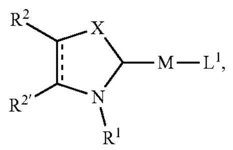

wherein $R^1$ is selected from the group consisting of substituted or unsubstituted linear or branched $C_{1-24}$ alkyl, substituted or unsubstituted $C_{5-7}$ cyclic alkyl, substituted or unsubstituted phenyl, and benzyl substituted with alkyl, alkoxy, or thio;

$R^2$ and $R^{2'}$ are each independently selected from the group consisting of substituted or unsubstituted linear or branched $C_{1-24}$ alkyl, substituted or unsubstituted $C_{5-7}$ cyclic alkyl, substituted or unsubstituted phenyl, and benzyl substituted with alkyl, alkoxy, or thio;

X is selected from the group consisting of $NR^3$, $CR^4R^5$, O, and S, wherein $R^3$, $R^4$ and $R^5$ each independently comprise H or substituted or unsubstituted linear or branched $C_{1-24}$ alkyl;

M comprises a metal; and $L^1$ comprises an anionic ligand, wherein exposing the semiconductor substrate to the precursor comprises a transmetallation process.

13. The method of claim 12, wherein the transmetallation process is conducted at a temperature in a range of from 100° C. to 350° C.

14. The method of claim 12, wherein M is selected from copper (Cu) and silver (Ag).

15. The method of claim 12, the precursor having a general formula (II):

(II)

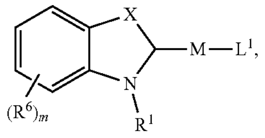

wherein $R^6$ is selected from the group consisting of $C_{1-24}$ alkyl, $C_{1-24}$ alkoxy, and $C_{1-24}$ thio.

16. The method of claim 12, wherein the anionic ligand comprises one or more of diketonate, ketoiminate, diiminate, acetate, trifluoroacetate, cyclopentadienyl, hexamethyldisilylamide, aminoalkoxide, and thiolate.

17. The method of claim 12, wherein the metal layer comprises the ligand $L^2$ and the metal layer comprises a metal M' selected from ruthenium (Ru), rhodium (Rh), palladium (Pd), iridium (Ir), platinum (Pt), gold (Au), manganese (Mn), iron (Fe), cobalt (Co), nickel (Ni), molybdenum (Mo), titanium (Ti), tantalum (Ta), and tungsten (W).

18. The method of claim 12, further comprising purging the semiconductor substrate.

19. The method of claim 18, wherein purging comprises flowing a purge gas over the semiconductor substrate, the purge gas comprising one or more of argon (Ar), nitrogen, hydrogen, and helium.

* * * * *